United States Patent
Li et al.

(10) Patent No.: US 9,960,195 B2
(45) Date of Patent: May 1, 2018

(54) METHOD FOR MANUFACTURING TFT BACKPLANE AND STRUCTURE OF TFT BACKPLANE

(71) Applicant: Shenzhen China Star Optoelectronics Technology Co., Ltd., Shenzhen, Guangdong (CN)

(72) Inventors: Wenhui Li, Guangdong (CN); Yifan Wang, Guangdong (CN); Chihyu Su, Guangdong (CN); Xiaowen Lv, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days. days.

(21) Appl. No.: 14/390,025

(22) PCT Filed: Aug. 15, 2014

(86) PCT No.: PCT/CN2014/084446
§ 371 (c)(1),
(2) Date: Oct. 1, 2014

(87) PCT Pub. No.: WO2016/011686
PCT Pub. Date: Jan. 28, 2016

(65) Prior Publication Data
US 2016/0027804 A1      Jan. 28, 2016

(30) Foreign Application Priority Data

Jul. 22, 2014  (CN) .......................... 2014 1 0351330

(51) Int. Cl.
*H01L 27/12*       (2006.01)

(52) U.S. Cl.
CPC ........ *H01L 27/127* (2013.01); *H01L 27/1225* (2013.01)

(58) Field of Classification Search
CPC . H01L 27/124; H01L 27/1255; H01L 27/127; H01L 27/3276
See application file for complete search history.

(56) References Cited

U.S. PATENT DOCUMENTS

2002/0145116 A1* 10/2002 Choo ................ H01L 27/14603
                                                                    250/370.09
2005/0263757 A1* 12/2005 Lee ..................... H01L 27/3211
                                                                    257/40

(Continued)

*Primary Examiner* — Eugene Lee
(74) *Attorney, Agent, or Firm* — Andrew C. Cheng

(57) ABSTRACT

The present invention provides method for manufacturing a TFT backplane and a structure of a TFT backplane. The method includes (1) forming a gate terminal (2) and a first metal electrode M1 on a substrate (1); (2) sequentially forming a gate insulation layer (3), a semiconductor layer, and an etch stop layer on the gate terminal (2), the first metal electrode M1, and the substrate (1) in a successive manner and applying a photolithographic operation to form an island-like semiconductor layer (4) and an island-like etch stop layer (5); (3) applying a photolithographic operation to patternize the island-like etch stop layer (5) and the gate insulation layer (3) to form a plurality of etch stop layer vias (51) and a gate insulation layer via (31); (4) forming source/drain terminals (6) and a second metal electrode M2; (5) forming a passivation protection layer (7); (6) forming a planarization layer (8); (7) forming a pixel electrode layer (9); (8) forming a pixel definition layer (10); and (9) forming a spacer pillar (11).

6 Claims, 7 Drawing Sheets

(56) References Cited

U.S. PATENT DOCUMENTS

| | | | |
|---|---|---|---|
| 2008/0044982 A1* | 2/2008 | You | H01L 27/12 438/443 |
| 2011/0068337 A1* | 3/2011 | Choi | H01L 29/78606 257/43 |
| 2011/0079787 A1* | 4/2011 | Choi | H01L 29/4908 257/71 |
| 2011/0168997 A1* | 7/2011 | Lee | H01L 27/1225 257/57 |
| 2012/0074834 A1* | 3/2012 | Kanegae | H01L 27/3276 313/498 |
| 2014/0061635 A1* | 3/2014 | Liu | H01L 29/66765 257/43 |
| 2014/0159010 A1* | 6/2014 | Song | H01L 27/3276 257/40 |
| 2015/0070643 A1* | 3/2015 | Kim | G02F 1/136213 349/139 |

* cited by examiner

METHOD FOR MANUFACTURING TFT BACKPLANE AND STRUCTURE OF TFT BACKPLANE

BACKGROUND OF THE INVENTION

1. Field of the Invention

The present invention relates to the field of displaying technology, and in particular to a method for manufacturing a TFT (Thin-Film Transistor) backplane and a structure of a TFT backplane.

2. The Related Arts

Flat panel displays have a variety of advantages, such as thin device body, low power consumption, and being free of radiation, and are thus widely used. Currently available flat panel displays generally include liquid crystal displays (LCDs) and organic light emitting displays (OLEDs)

Organic light emitting displays (OLEDs) have a variety of superior properties, such as being self-luminous, requiring no backlighting, high contrast, reduced thickness, wide view angle, fast response, applicability to flexible panels, wide range of operation temperature, and having simple structure and manufacturing process, and are regarded as emerging technology of the next generation flat panel displays.

The TFTs are a vital constituent part of the flat panel displays. Since the TFTs can be formed on a glass substrate or a plastic substrate, they are commonly used as switch devices and driver devices for devices, such as LCDs, OLEDs, and electro-phoretic displays (EPDs).

Oxide semiconductor TFT technology is the most attention-attracting technology currently. The oxide semiconductors have a relatively high electron mobility and, compared to low-temperature poly-silicon, the oxide semiconductors have a simple manufacturing process and high compatibility to amorphous silicon manufacturing processes, being applicable to the fields of LCDs, OLEDs, and flexible displays, and are also compatible to high generation manufacturing lines, being applicable to large-, medium-, and small-sized displays, making them possess excellent prosperous future of development.

A conventional structure of an oxide semiconductor TFT backplane that is considered relatively mature is one that includes an etch stop layer. As shown in FIGS. 1-10, a method for manufacturing a conventional oxide semiconductor TFT backplane comprises the following steps:

Step 1: providing a substrate 100, forming a first metal layer on the substrate 100, and applying a photolithographic operation to patternize the first metal layer so as to form a gate terminal 200 on one side portion of the substrate 100 and a first metal electrode M1 on an opposite side portion of the substrate 100;

Step 2: forming a gate insulation layer 300 on the gate terminal 200, the first metal electrode M1, and the substrate 100 and applying a photolithographic operation to patternize the gate insulation layer 300 to form a gate insulation layer via 310 for exposing a portion of the gate terminal 200;

Step 3: forming a film on the gate insulation layer 300 and applying a photolithographic operation to patternize the film to form an island-like oxide semiconductor layer 400;

Step 4: forming an etch stop layer 500 on the oxide semiconductor layer 400 and the gate insulation layer 300 and applying a photolithographic operation to patternize the etch stop layer 500 to a plurality of etch stop layer vias 510 for exposing portions of the oxide semiconductor layer 400;

Step 5: forming a second metal layer on the etch stop layer 500 and applying a photolithographic operation to patternize the second metal layer to form source/drain terminals 600 on one side portion of the substrate 100 and a second metal electrode M2 on an opposite portion of the substrate 100, wherein the source/drain terminals 600 fill up the plurality of etch stop layer vias 510 to connect to the oxide semiconductor layer 400 and the source/drain terminals 600 fill up the gate insulation layer via 310 to connect to the gate terminal 200;

wherein the first metal electrode M1, the second metal electrode M2, and a portion of the gate insulation layer 300 and a portion of the etch stop layer 500 that are sandwiched between the first and second metal electrodes M1, M2 form a storage capacitor C;

Step 6: forming a passivation protection layer 700 on the source/drain terminals 600 and the second metal electrode M2, followed by patternizing by applying a photolithographic operation;

Step 7: forming a planarization layer 800 on the passivation protection layer 700, followed by patternizing by applying a photolithographic operation;

Step 8: forming a pixel electrode layer 900 on the planarization layer 800, followed by patternizing by applying a photolithographic operation;

Step 9: forming a pixel definition layer 1000 on the pixel electrode layer 900 and the planarization layer 800, followed by patternizing by applying a photolithographic operation; and Step 10: forming a spacer pillar 1100 on the pixel definition layer 1000.

The conventional oxide semiconductor TFT backplane manufacturing method suffers certain problems, which are generally presented in three aspects: The first one is that the manufacture of the oxide semiconductor TFT backplane requires ten processes of photolithographic operation, wherein the manufacture of the etch stop layer 500 requires a complete process of photolithographic operation (including the steps of film forming, yellow light, etching, and stripping). This leads to an extended operation process, a reduced manufacturing efficiency, and an increase of manufacturing cost, and the more the manufacturing steps, the more the yield problems there will be. The second one is that the gate insulation layer 300, the oxide semiconductor layer 400, and the etch stop layer 500 are not formed consecutively so that the interfaces of the oxide semiconductor layer 400 and with respect to the other two layers may be readily contaminated by etching solutions and stripping solutions, leading to a potential risk of deterioration of the performance of the TFT. The third one is that the storage capacitor C is formed of the first metal electrode M1, the second metal electrode M2, and a portion of the gate insulation layer 300 and a portion of the etch stop layer 500 sandwiched between the first and second metal electrodes M1, M2 and due to an additional thickness resulting from the presence of the etch stop layer 500, the storage capacitor C requires an enlarged area, which causes reduction of aperture ratio.

Thus, it is desired to improve the conventional method to eliminate the problems existing therein.

SUMMARY OF THE INVENTION

An object of the present invention is to provide a method for manufacturing a thin-film transistor (TFT) backplane, which reduces photolithographic operations, shortens the manufacturing process, enhance manufacturing efficiency, reduce manufacturing cost, and increase yield rate and can avoid contaminations occurring in the interfaces between a semiconductor layer and a gate insulation layer and an etch stop layer so as to ensure the performance of the TFT and to reduce the area of a storage capacitor to thereby increase the aperture ratio.

Another object of the present invention is to provide a structure of a TFT backplane, which has a shortened manufacturing process, increased manufacturing efficiency and yield rate, and a reduced manufacturing cost, and can ensure the performance of a TFT and has a storage capacitor that has a reduced area so as to increase the aperture ratio.

To achieve the above objects, the present invention provides a method for manufacturing a thin-film transistor (TFT) backplane, which comprises the following steps:

(1) providing a substrate, forming a first metal layer on the substrate and patternizing the first metal layer so as to form a gate terminal on one side portion of the substrate and a first metal electrode M1 on an opposite side portion of the substrate;

(2) successively forming a gate insulation layer, a semiconductor layer, and an etch stop layer on the gate terminal, the first metal electrode M1, and the substrate and applying a photolithographic operation to patternize the semiconductor layer and the etch stop layer so as to form an island-like semiconductor layer and an island-like etch stop layer;

(3) applying a photolithographic operation to patternize the island-like etch stop layer and the gate insulation layer so as to form a plurality of etch stop layer vias and a gate insulation layer via to respectively expose portions of the semiconductor layer and a portion of the gate terminal;

(4) forming a second metal layer on the island-like etch stop layer and the gate insulation layer and patternizing the second metal layer to form source/drain terminals on one side portion of the substrate and a second metal electrode M2 on an opposite side portion of the substrate, wherein the source/drain terminals fill up the plurality of etch stop layer vias to connect to the semiconductor layer and the source/drain terminals fill up the gate insulation layer via to connect to the gate terminal; and a portion of the gate insulation layer that is located on said opposite side portion of the substrate is sandwiched between the second metal electrode M2 and the first metal electrode M1;

(5) forming a passivation protection layer on the source/drain terminals and the second metal electrode M2 and patternizing the passivation protection layer;

(6) forming a planarization layer on the passivation protection layer and patternizing the planarization layer;

(7) forming a pixel electrode layer on the planarization layer and patternizing the pixel electrode layer, wherein the pixel electrode is connected to the source/drain terminals; and (8) forming a pixel definition layer on the pixel electrode layer and the planarization layer and patternizing the pixel definition layer.

The method for manufacturing a TFT backplane further comprises step (9) for forming a spacer pillar on the pixel definition layer.

The first metal electrode M1, the second metal electrode M2, and the portion of the gate insulation layer sandwiched between the first and second metal electrodes M1, M2 form a storage capacitor C.

The semiconductor layer comprises an oxide semiconductor layer or a non-oxide semiconductor layer.

The oxide semiconductor layer comprises an indium gallium zinc oxide (IGZO) semiconductor layer.

The passivation protection layer is made of a material that is an inorganic material; the planarization layer is made of a material that is an organic material; the pixel electrode layer is made of a material comprising indium tin oxide (ITO) or indium zinc oxide (IZO); and the pixel definition layer is made of a material that is an organic material.

The present invention also provides a thin-film transistor (TFT) backplane structure, which comprises a substrate, a gate terminal formed on a side portion of the substrate, a first metal electrode M1 formed on an opposite side portion of the substrate, a gate insulation layer formed on the gate terminal, the first metal electrode M1, and the substrate, an island-like semiconductor layer formed on the gate insulation layer, an island-like etch stop layer formed on the semiconductor layer, source/drain terminals formed on the etch stop layer, a second metal electrode M2 formed on a portion of the gate insulation layer that is located on the first metal electrode M1, a passivation protection layer formed on the source/drain terminals and the second metal electrode M2, a planarization layer formed on the passivation protection layer, a pixel electrode layer formed on the planarization layer, and a pixel definition layer formed on the pixel electrode layer and the planarization layer. The gate insulation layer comprises a gate insulation layer via formed therein. The etch stop layer comprises a plurality of etch stop layer vias formed therein. The source/drain terminals fill up the plurality of etch stop layer vias to connect to the semiconductor layer. The source/drain terminals fill up the gate insulation layer via to connect to the gate terminal. The first metal electrode M1, the second metal electrode M2, and a portion of the gate insulation layer sandwiched between the first and second metal electrodes M1, M2 form a storage capacitor C. The pixel electrode is connected to the source/drain terminals.

The TFT backplane structure further comprises a spacer pillar formed on the pixel definition layer.

The semiconductor layer comprises an oxide semiconductor layer or a non-oxide semiconductor layer; the passivation protection layer is made of a material that is an inorganic material; the planarization layer is made of a material that is an organic material; the pixel electrode layer is made of a material comprising indium tin oxide (ITO) or indium zinc oxide (IZO); and the pixel definition layer is made of a material that is an organic material.

The oxide semiconductor layer comprises an indium gallium zinc oxide (IGZO) semiconductor layer.

The efficacy of the present invention is that the present invention provides a method for manufacturing a TFT backplane, which comprises forming a gate insulation layer, a semiconductor layer, and an etch stop layer in a successive manner and applying a photolithographic operation to form an island-like semiconductor layer and an island-like etch stop layer and further applying a photolithographic operation to form a plurality of etch stop layer vias and a gate insulation layer via so as to so as to shorten the manufacturing process, enhance manufacturing efficiency, reduce manufacturing cost, and improve product yield, avoid contamination occurring in interfaces between the semiconductor layer and the gate insulation layer and the etch stop layer to thereby ensure the performance of the TFT, and to include only a single gate insulation layer between the first and second metal electrodes to reduce the area of the storage capacitor thereby increasing aperture ratio. The present invention provides a structure of a TFT backplane, which comprises an arrangement of an island-like semiconductor layer and etch stop layer so as to shorten the manufacturing process, enhance manufacturing efficiency, reduce manufacturing cost, and improve product yield, and also to ensure the performance of the TFT and to include only a single gate insulation layer between the first and second metal electrodes to reduce the area of the storage capacitor thereby increasing aperture ratio.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
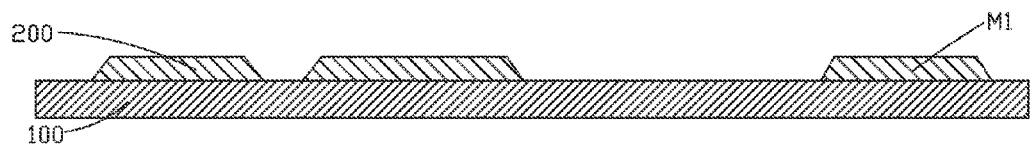
FIG. 1 is a schematic view showing a first step of a conventional method for manufacturing an oxide semiconductor TFT backplane.
Figure 2:
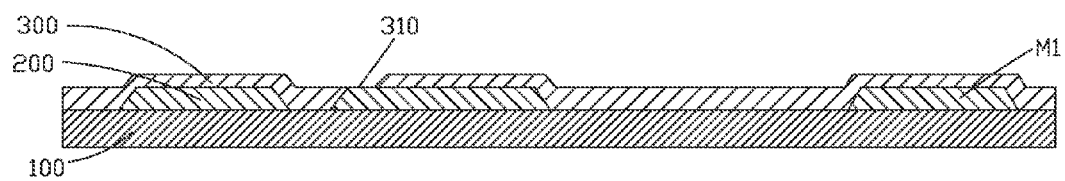
FIG. 2 is a schematic view showing a second step of the conventional method for manufacturing an oxide semiconductor TFT backplane.
Figure 3:
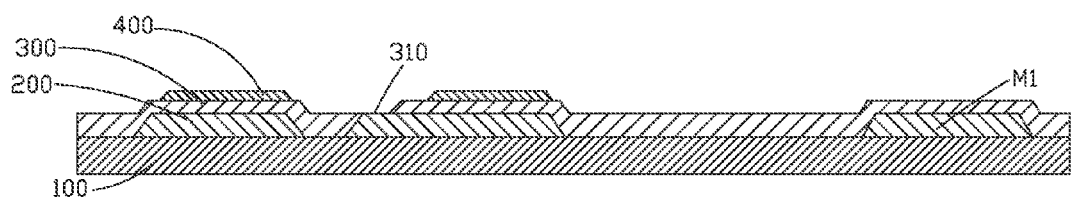
FIG. 3 is a schematic view showing a third step of the conventional method for manufacturing an oxide semiconductor TFT backplane.
Figure 4:
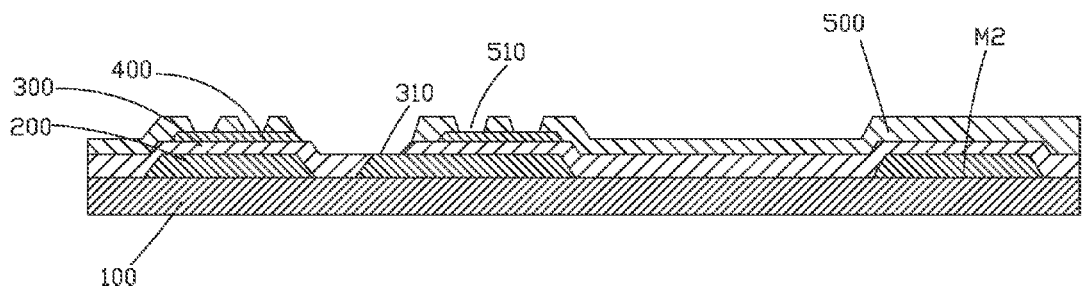
FIG. 4 is a schematic view showing a fourth step of the conventional method for manufacturing an oxide semiconductor TFT backplane.
Figure 5:
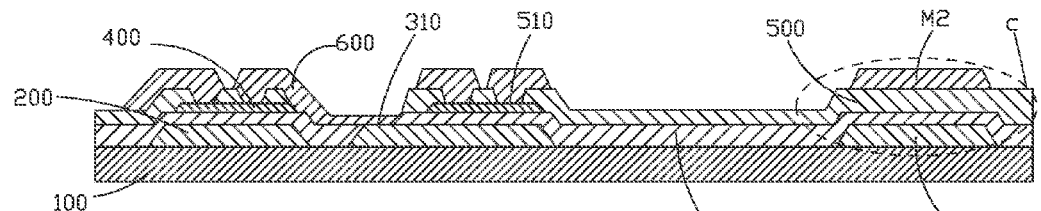
FIG. 5 is a schematic view showing a fifth step of the conventional method for manufacturing an oxide semiconductor TFT backplane.
Figure 6:
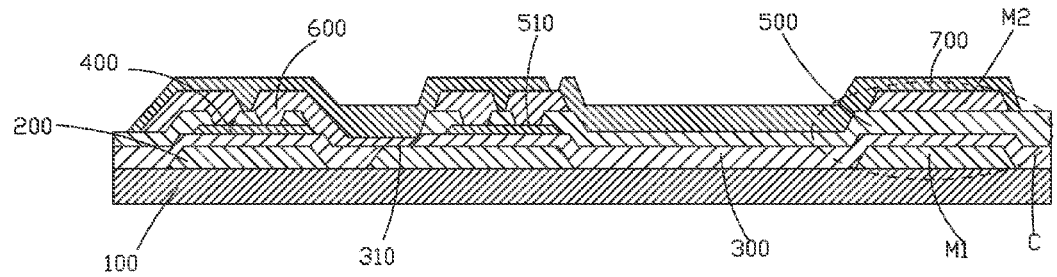
FIG. 6 is a schematic view showing a sixth step of the conventional method for manufacturing an oxide semiconductor TFT backplane.
Figure 7:
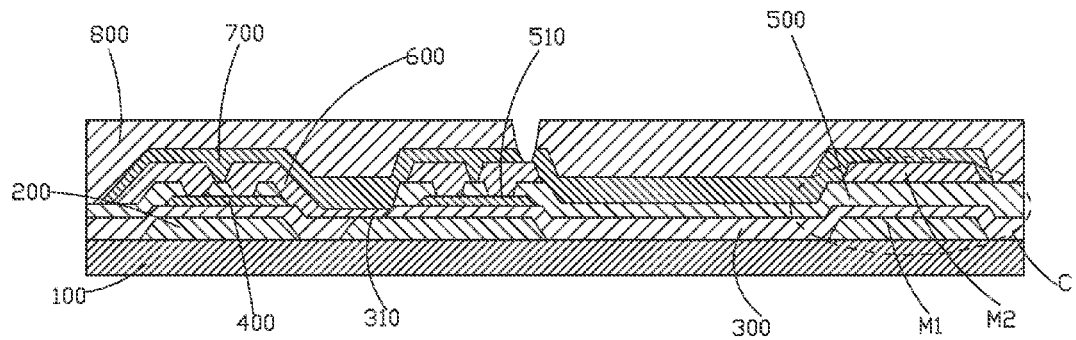
FIG. 7 is a schematic view showing a seventh step of the conventional method for manufacturing an oxide semiconductor TFT backplane.
Figure 8:
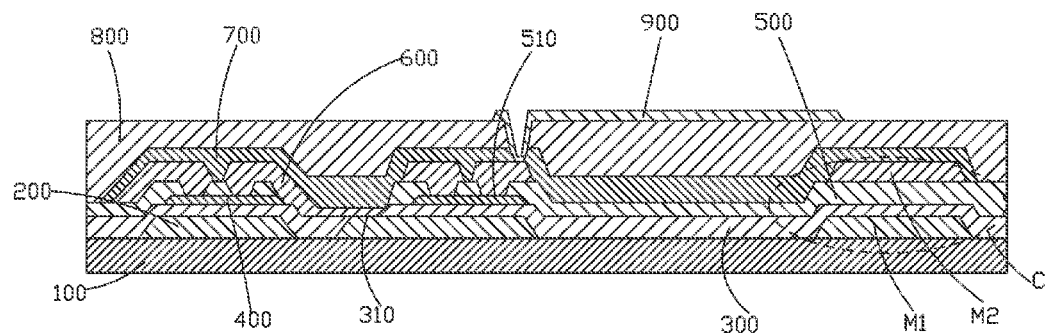
FIG. 8 is a schematic view showing an eighth step of the conventional method for manufacturing an oxide semiconductor TFT backplane.
Figure 9:
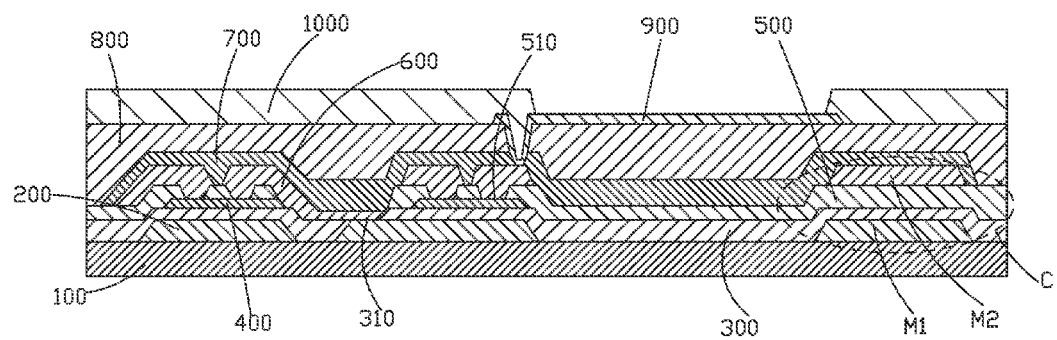
FIG. 9 is a schematic view showing a ninth step of the conventional method for manufacturing an oxide semiconductor TFT backplane.
Figure 10:
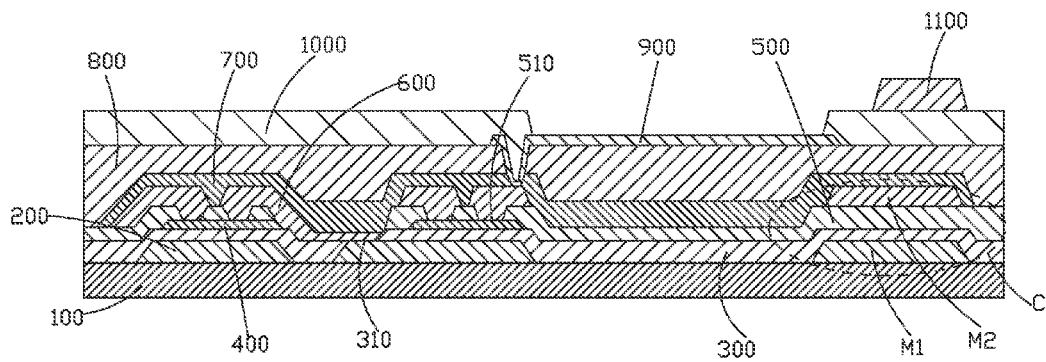
FIG. 10 is a schematic view showing a tenth step of the conventional method for manufacturing an oxide semiconductor TFT backplane.
Figure 11:
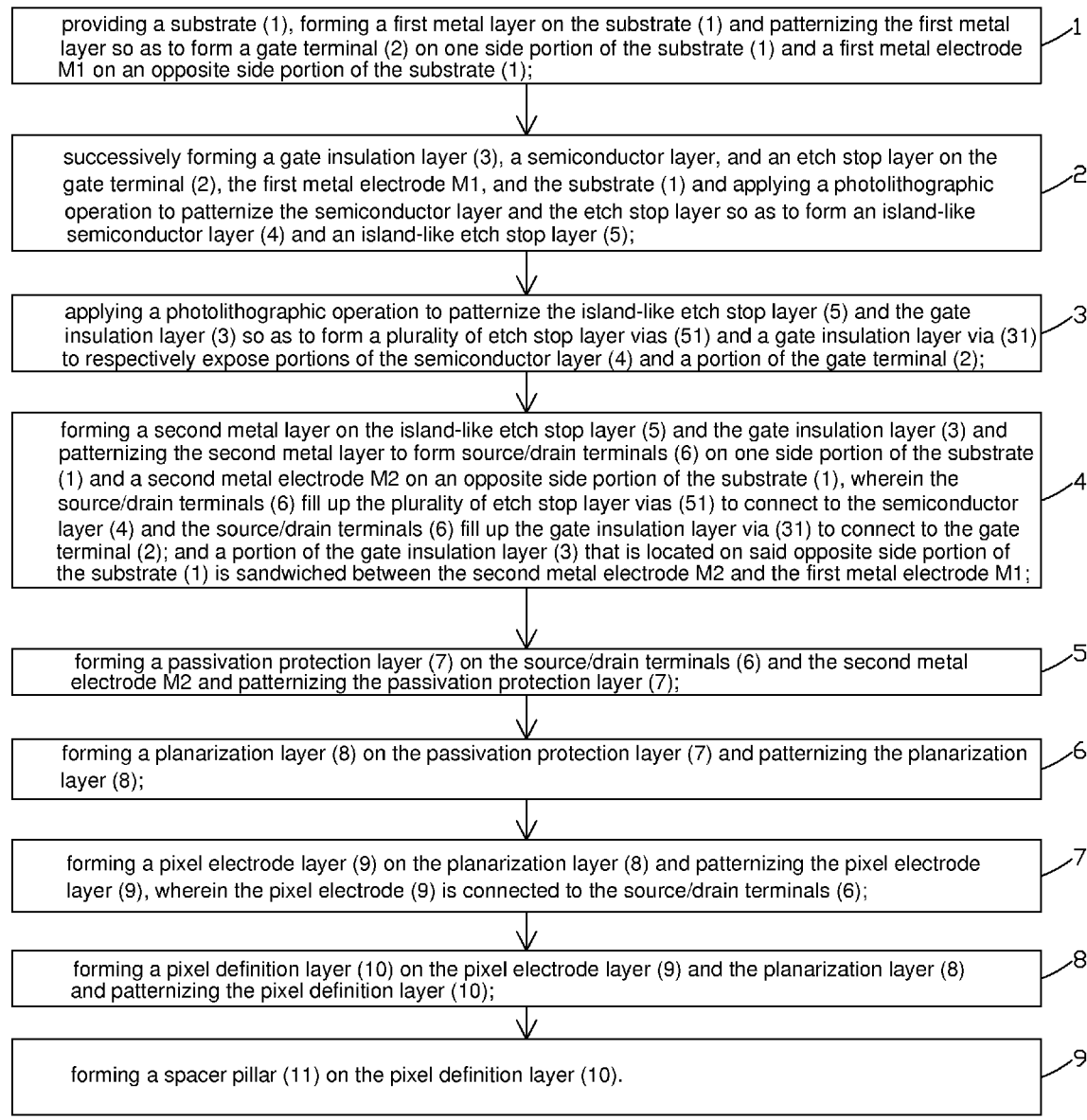
FIG. 11 is a flow chart illustrating a method for manufacturing a TFT backplane according to the present invention.
Figure 12:
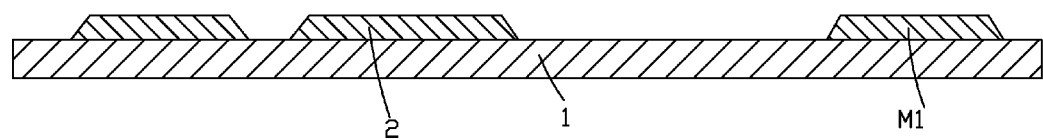
FIG. 12 is a schematic view showing a first step of the method for manufacturing a TFT backplane according to the present invention.

Referring to FIG. 11, firstly, the present invention provides a method for manufacturing a TFT backplane. The method comprises the following steps:

Step 1: referring to FIG. 12, providing a substrate 1, forming a first metal layer on the substrate 1 and applying an photolithographic operation to patternize the first metal layer so as to form a gate terminal 2 on one side portion of the substrate 1 and a first metal electrode M1 on an opposite side portion of the substrate 1.

The substrate 1 is a transparent substrate, and preferably, the substrate 1 is a glass substrate.

Figure 13:
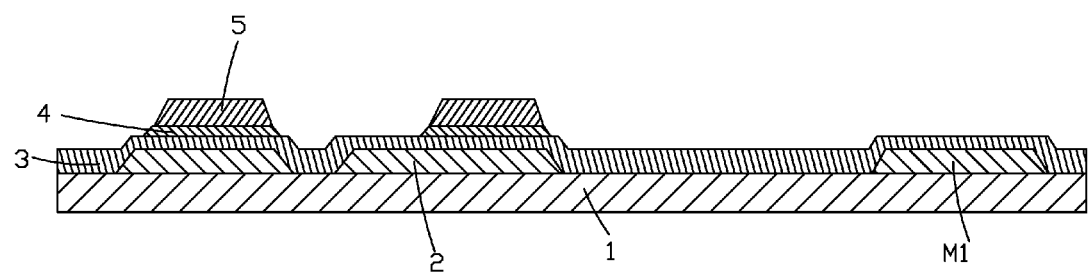
FIG. 13 is a schematic view showing a second step of the method for manufacturing a TFT backplane according to the present invention.

Step 2: referring to FIG. 13, successively forming a gate insulation layer 3, a semiconductor layer, and an etch stop layer on the gate terminal 2, the first metal electrode M1, and the substrate 1 and applying a photolithographic operation to patternize the semiconductor layer and the etch stop layer so as to form an island-like semiconductor layer 4 and an island-like etch stop layer 5.

In Step 2, since the gate insulation layer 3, the semiconductor layer, and the etch stop layer are formed in a successive manner, contamination of interfaces of the island-like semiconductor layer 4 with respect to the gate insulation layer 3 and the island-like etch stop layer 5 can be avoided to thereby ensure the performance of a TFT and make the property of the TFT stable.

Specifically, the semiconductor layer 4 comprises an oxide semiconductor layer or a non-oxide semiconductor layer, and further, the oxide semiconductor layer can be an indium gallium zinc oxide (IGZO) semiconductor layer.

Figure 14:
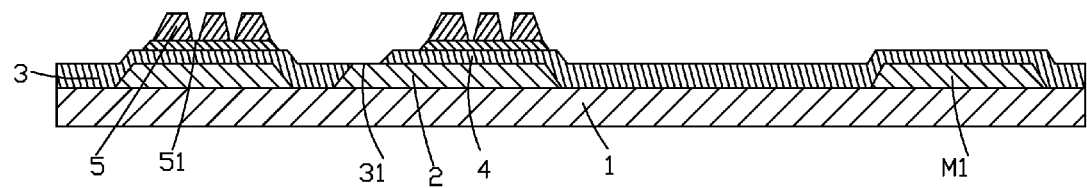
FIG. 14 is a schematic view showing a third step of the method for manufacturing a TFT backplane according to the present invention.

Step 3: referring to FIG. 14, applying a photolithographic operation to patternize the island-like etch stop layer 5 and the gate insulation layer 3 so as to form a plurality of etch stop layer vias 51 and a gate insulation layer via 31 to respectively expose portions of the semiconductor layer 4 and a portion of the gate terminal 2.

The combined operation of Step 2 and Step 3 allows for patternization of the gate insulation layer 3, the semiconductor layer 4, and the etch stop layer 5 by applying just two photolithographic operations. This, compared to the conventional oxide semiconductor TFT backplane manufacturing method, saves one photolithographic operation, so as to shorten the manufacturing process, enhance manufacturing efficiency, reduce manufacturing cost, and improve product yield.

Figure 15:
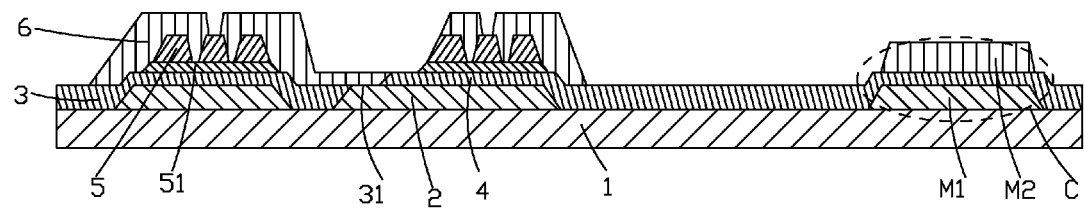
FIG. 15 is a schematic view showing a fourth step of the method for manufacturing a TFT backplane according to the present invention.

Step 4: referring to FIG. 15, forming a second metal layer on the island-like etch stop layer 5 and the gate insulation layer 3 and patternizing the second metal layer to form source/drain terminals 6 on one side portion of the substrate 1 and a second metal electrode M2 on an opposite side portion of the substrate 1.

The source/drain terminals 6 fill up the plurality of etch stop layer vias 51 to connect to the semiconductor layer 4;

and the source/drain terminals 6 also fill up the gate insulation layer via 31 to connect to the gate terminal 2.

A portion of the gate insulation layer 3 that is located on said opposite side portion of the substrate 1 is sandwiched between the second metal electrode M2 and the first metal electrode M1. The first metal electrode M1, the second metal electrode M2, and the portion of the gate insulation layer 3 sandwiched between the first and second metal electrodes M1, M2 form a storage capacitor C. Compared to the conventional oxide semiconductor TFT backplane manufacturing method, since the first and second metal electrodes M1, M2 that form the storage capacitor C does not include an etch stop layer therebetween, the spacing distance between the first and second metal electrodes M1, M2 is reduced so that with the same effective capacitance, the storage capacitor C can be of a reduced area, thereby increasing the aperture ratio.

Figure 16:
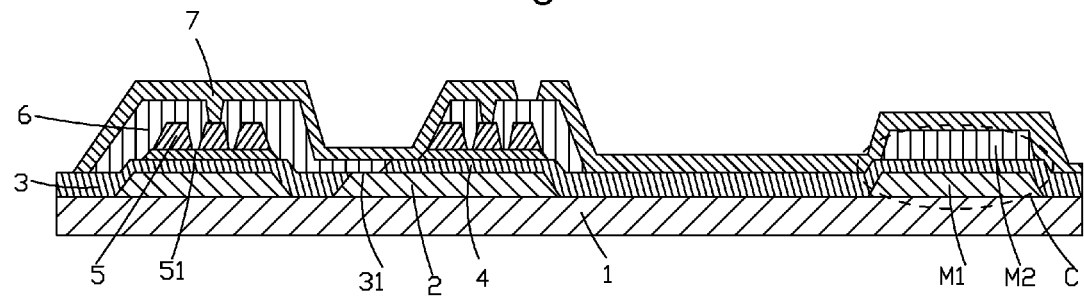
FIG. 16 is a schematic view showing a fifth step of the method for manufacturing a TFT backplane according to the present invention.

Step 5: referring to FIG. 16, forming a passivation protection layer 7 on the source/drain terminals 6 and the second metal electrode M2 and applying a photolithographic operation to patternize the passivation protection layer 7.

Specifically, the material that makes the passivation protection layer 7 is an inorganic material.

Figure 17:
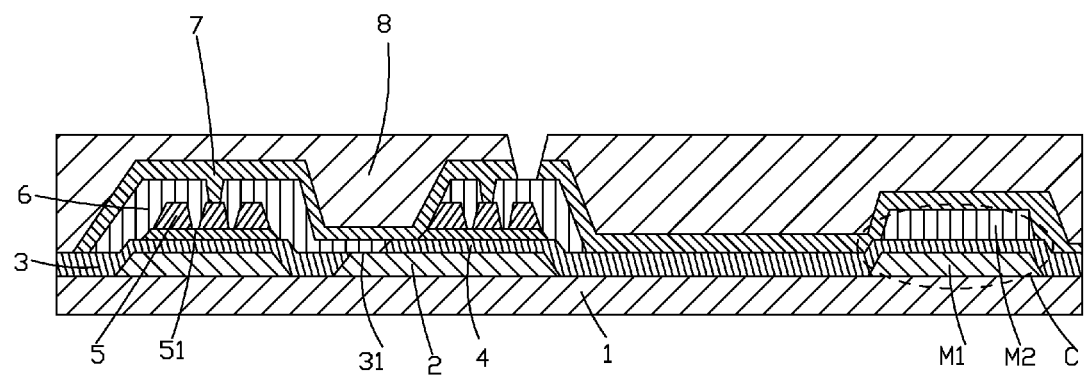
FIG. 17 is a schematic view showing a sixth step of the method for manufacturing a TFT backplane according to the present invention.

Step 6: referring to FIG. 17, forming a planarization layer 8 on the passivation protection layer 7 and applying a photolithographic operation to patternize the planarization layer 8.

Specifically, the material that makes the planarization layer 8 is an organic material.

Figure 18:
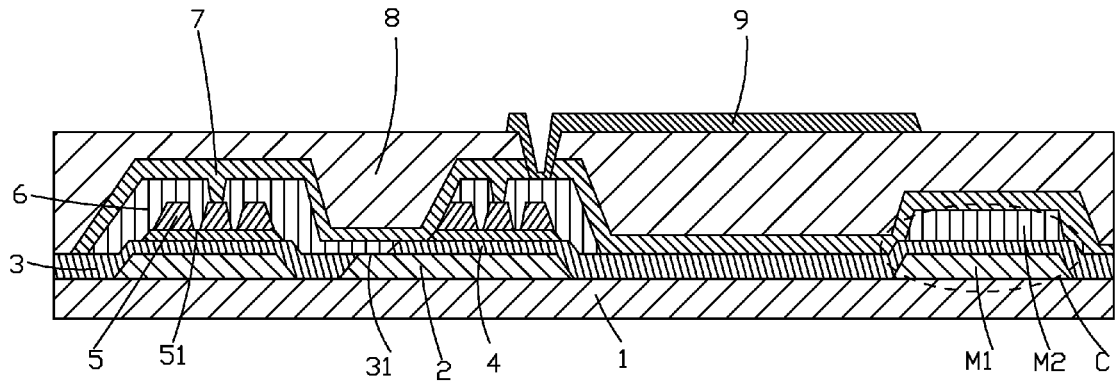
FIG. 18 is a schematic view showing a seventh step of the method for manufacturing a TFT backplane according to the present invention.

Step 7: referring to FIG. 18, forming a pixel electrode layer 9 on the planarization layer 8 and applying a photolithographic operation to patternize the pixel electrode layer 9.

The pixel electrode 9 is connected to the source/drain terminals 6.

The material that makes the pixel electrode 9 comprises indium tin oxides (ITO) or indium zinc oxides (IZO).

Figure 19:
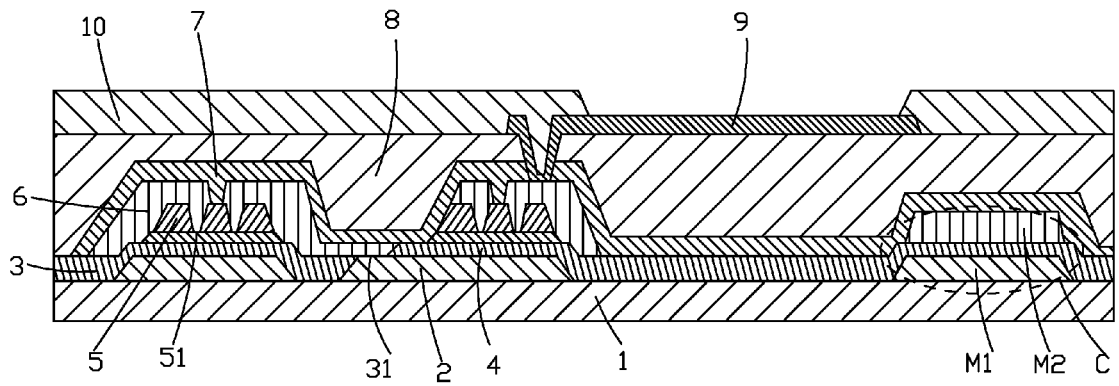
FIG. 19 is a schematic view showing an eighth step of the method for manufacturing a TFT backplane according to the present invention.

Step 8: referring to FIG. 19, forming a pixel definition layer 10 on the pixel electrode layer 9 and the planarization layer 8 and applying a photolithographic operation to patternize the pixel definition layer 10.

Specifically, the material that makes the pixel definition layer 10 is an organic material.

Figure 20:
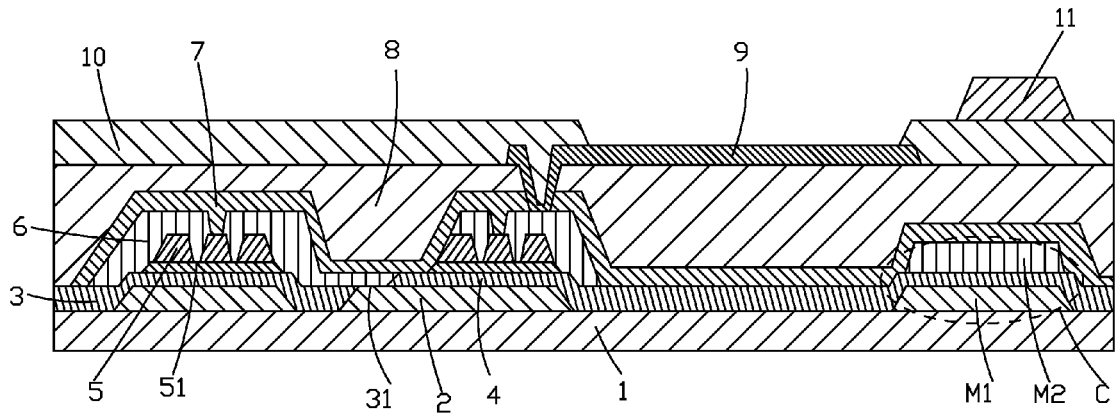
FIG. 20 is a schematic view showing a ninth step of the method for manufacturing a TFT backplane according to the present invention and also illustrating a structure of the TFT backplane according to the present invention.

Step 9: referring to FIG. 20, forming a spacer pillar 11 on the pixel definition layer 10.

It is noted here that Step 9 can be omitted according to the requirements of products or manufacturing processes.

As shown in FIG. 20, the present invention also provides a structure of a TFT backplane manufactured with such a method and comprising a substrate 1, a gate terminal 2 formed on a side portion of the substrate 1, a first metal electrode M1 formed on an opposite side portion of the substrate 1, agate insulation layer 3 formed on the gate terminal 2, the first metal electrode M1, and the substrate 1, an island-like semiconductor layer 4 formed on the gate insulation layer 3, an island-like etch stop layer 5 formed on the semiconductor layer 4, source/drain terminals 6 formed on the etch stop layer 5, a second metal electrode M2 formed on a portion of the gate insulation layer 3 that is located on the first metal electrode M1, a passivation protection layer 7 formed on the source/drain terminals 6 and the second metal electrode M2, a planarization layer 8 formed on the passivation protection layer 7, a pixel electrode layer 9 formed on the planarization layer 8, and a pixel definition layer 10 formed on the pixel electrode layer 9 and the planarization layer 8 and further comprising a spacer pillar 11 formed on the pixel definition layer 10.

The gate insulation layer 3 comprises a gate insulation layer via 31 formed therein and the etch stop layer 5 comprises a plurality of etch stop layer vias 51 formed therein. The source/drain terminals 6 fill up the plurality of etch stop layer vias 51 to connect to the semiconductor layer 4 and the source/drain terminals 6 fill up the gate insulation layer via 31 to connect to the gate terminal 2. The first metal electrode M1, the second metal electrode M2, and a portion of the gate insulation layer 3 sandwiched between the first and second metal electrodes M1, M2 form a storage capacitor C. The pixel electrode 9 is connected to the source/drain terminals 6.

The gate insulation layer 3, the semiconductor layer 4, and the etch stop layer 5 are formed in a successive manner, wherein a photolithographic operation is apply to form the island-like semiconductor layer 4 and the island-like etch stop layer 5 and a photolithographic operation is further applied to form a plurality of etch stop layer vias 51 and a gate insulation layer via 31 so as to shorten the manufacturing process, enhance manufacturing efficiency, reduce manufacturing cost, and improve product yield and to ensure the performance of the TFT. The first and second metal electrodes M1, M2 that form the storage capacitor C include only a single gate insulation layer 3 therebetween so that the area of the storage capacitor C can be reduced thereby increasing the aperture ratio.

Specifically, the semiconductor layer 4 can be an oxide semiconductor layer or a non-oxide semiconductor layer; the material that makes the passivation protection layer 7 can be an inorganic material; the material that makes the planarization layer 8 can be an organic material; the material that makes the pixel electrode layer 9 can be ITO or IZO; and the material that makes the pixel definition layer 10 can be an organic material.

Further, the oxide semiconductor layer comprises an IGZO semiconductor layer.

In summary, the present invention provides a method for manufacturing a TFT backplane, which comprises forming a gate insulation layer, a semiconductor layer, and an etch stop layer in a successive manner and applying a photolithographic operation to form an island-like semiconductor layer and an island-like etch stop layer and further applying a photolithographic operation to form a plurality of etch stop layer vias and a gate insulation layer via so as to so as to shorten the manufacturing process, enhance manufacturing efficiency, reduce manufacturing cost, and improve product yield, avoid contamination occurring in interfaces between the semiconductor layer and the gate insulation layer and the etch stop layer to thereby ensure the performance of the TFT, and to include only a single gate insulation layer between the first and second metal electrodes to reduce the area of the storage capacitor thereby increasing aperture ratio. The present invention provides a structure of a TFT backplane, which comprises an arrangement of an island-like semiconductor layer and etch stop layer so as to shorten the manufacturing process, enhance manufacturing efficiency, reduce manufacturing cost, and improve product yield, and also to ensure the performance of the TFT and to include only a single gate insulation layer between the first and second metal electrodes to reduce the area of the storage capacitor thereby increasing aperture ratio.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for manufacturing a thin-film transistor (TFT) backplane, comprising the following steps:
    (1) providing a substrate, forming a first metal layer on the substrate and patternizing the first metal layer so as to form gate terminals on one side portion of the substrate and a first metal electrode M1 on an opposite side portion of the substrate;
    (2) successively forming a gate insulation layer, a semiconductor layer, and an etch stop layer on the gate terminals, the first metal electrode M1, and the substrate and conducting one single photolithographic operation such that the semiconductor layer and the etch stop layer are both patternized in the one single photolithographic operation so as to form island-like semiconductor layers and island-like etch stop layers, both corresponding to the gate terminals respectively, such that the island-like etch stop layers are respectively stacked on the island-like semiconductor layers to form two separate stacks on the gate insulation layer and the two stacks are separate from each other with a predetermined portion of the gate insulation layer exposed therebetween without being covered by the island-like etch stop layers, wherein a portion of a first one of the gate terminals is located between the two stacks and is covered only by the predetermined portion of the gate insulation layer exposed between the two stacks;
    (3) applying a photolithographic operation to patternize the island-like etch stop layers and the gate insulation layer to remove parts of the island-like etch stop layers and a part of the predetermined portion of the gate insulation layer exposed between the two stacks so as to form a plurality of etch stop layer vias in the island-like etch stop layers and a gate insulation layer via in the predetermined portion of the gate insulation layer exposed between the two stacks to respectively expose portions of the island-like semiconductor layers and the portion of the first one of the gate terminals, wherein the gate insulation layer via is formed in the predetermined portion of the gate insulation layer to expose the portion of the first one of the gate terminals;
    (4) forming a second metal layer on the island-like etch stop layers and the gate insulation layer_such that the second metal layer fills up each of the etch stop layer vias and the gate insulation layer via simultaneously and patternizing the second metal layer to form source/drain terminals on said one side portion of the substrate and corresponding to each of the gate terminals and a second metal electrode M2 on said opposite side portion of the substrate, wherein the source/drain terminals fill up the plurality of etch stop layer vias to connect to the island-like semiconductor layers and a part of one of the source/drain terminals corresponding to a second one of the gate terminals fills up the gate insulation layer via to have the part of the source/drain terminals corresponding to the second one of the gate terminals connected to the first one of the gate terminals; and a portion of the gate insulation layer that is located on said opposite side portion of the substrate is sandwiched between the second metal electrode M2 and the first metal electrode M1 and has opposite surfaces respectively in direct engagement with the second metal electrode M2 and the first metal electrode M1;
    (5) forming a passivation protection layer on the source/drain terminals and the second metal electrode M2 and patternizing the passivation protection layer;
    (6) forming a planarization layer on the passivation protection layer and patternizing the planarization layer;
    (7) forming a pixel electrode layer on the planarization layer and patternizing the pixel electrode layer, wherein the pixel electrode is connected to one of the source/drain terminals corresponding to the first one of the gate terminals; and
    (8) forming a pixel definition layer on the pixel electrode layer and the planarization layer and patternizing the pixel definition layer.

2. The method for manufacturing a TFT backplane as claimed in claim 1 further comprising step (9) for forming a spacer pillar on the pixel definition layer.

3. The method for manufacturing a TFT backplane as claimed in claim 1, wherein the first metal electrode M1, the second metal electrode M2, and the portion of the gate insulation layer sandwiched between the first and second metal electrodes M1, M2 form a storage capacitor C.

4. The method for manufacturing a TFT backplane as claimed in claim 1, wherein the semiconductor layer comprises an oxide semiconductor layer or a non-oxide semiconductor layer.

5. The method for manufacturing a TFT backplane as claimed in claim 4, wherein the oxide semiconductor layer comprises an indium gallium zinc oxide (IGZO) semiconductor layer.

6. The method for manufacturing a TFT backplane as claimed in claim 1, wherein the passivation protection layer is made of a material that is an inorganic material; the planarization layer is made of a material that is an organic material; the pixel electrode layer is made of a material comprising indium tin oxide (ITO) or indium zinc oxide (IZO); and the pixel definition layer is made of a material that is an organic material.

* * * * *